US011133268B2

(12) United States Patent
Sinha et al.

(10) Patent No.: US 11,133,268 B2
(45) Date of Patent: Sep. 28, 2021

(54) CRACK BIFURCATION IN BACK-END-OF-LINE

(71) Applicant: International Business Machines Corporation, Armonk, NY (US)

(72) Inventors: Tuhin Sinha, Oradell, NJ (US); Naftali Eliahu Lustig, Croton on Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 147 days.

(21) Appl. No.: 16/422,237

(22) Filed: May 24, 2019

(65) Prior Publication Data
US 2020/0373250 A1 Nov. 26, 2020

(51) Int. Cl.
*H01L 23/00* (2006.01)
*H01L 21/033* (2006.01)
*H01L 21/768* (2006.01)

(52) U.S. Cl.
CPC ........ *H01L 23/562* (2013.01); *H01L 21/0337* (2013.01); *H01L 21/76831* (2013.01); *H01L 21/76832* (2013.01)

(58) Field of Classification Search
CPC ............. H01L 23/562; H01L 21/76831; H01L 21/76832; H01L 23/02
See application file for complete search history.

(56) References Cited

U.S. PATENT DOCUMENTS

| 6,365,958 | B1 | 4/2002 | Ibnabdeljalil et al. |
| 6,372,661 | B1 | 4/2002 | Lin et al. |
| 8,076,756 | B2 | 12/2011 | Lane et al. |
| 8,227,527 | B2 | 7/2012 | Hoa et al. |
| 9,443,779 | B2 | 9/2016 | Takematsu et al. |
| 9,735,074 | B1 | 8/2017 | Sekine |
| 9,824,982 | B1 | 11/2017 | Briggs et al. |

(Continued)

OTHER PUBLICATIONS

Mohamed Rabie et al., "Innovative Design of Crackstop Wall for 14nm Technology Node and Beyond," 68th Electronic Components and Technology Conference (ECTC), 2018, pp. 460-466.

(Continued)

*Primary Examiner* — Tucker J Wright
(74) *Attorney, Agent, or Firm* — Cantor Colburn LLP; Tihon Poltavets

(57) ABSTRACT

Embodiments of the present invention are directed to a new crack stop system and a method for providing an interlayer dielectric (ILD) crack bifurcation in semiconductor back-end-of-line (BEOL). In a non-limiting embodiment of the invention, a crack stop is formed over a substrate. The crack stop can span one or more dielectric layers. A topologically interlocking composite structure is formed adjacent to the crack stop and over the substrate. The topologically interlocking composite structure spans the one or more dielectric layers. A capping film is formed over the topologically interlocking composite structure and one or more metal interconnect layers are formed over the capping film. The composite structure includes a bulk matrix material and embedded inclusions. To promote crack bifurcation, materials of the inclusions and bulk matrix material are selected to ensure that the Young's modulus of the inclusions is greater than the Young's modulus of the bulk matrix material.

20 Claims, 19 Drawing Sheets

(56) References Cited

U.S. PATENT DOCUMENTS

| | | |
|---|---|---|
| 2009/0096104 A1* | 4/2009 | Lee .................. H01L 23/585 |
| | | 257/758 |
| 2011/0049684 A1 | 3/2011 | Lee et al. |
| 2015/0325531 A1 | 11/2015 | Dyer et al. |
| 2018/0174982 A1 | 6/2018 | Christiansen et al. |

OTHER PUBLICATIONS

Phuong Nguyen-Tri et al., "Nanocomposite Coatings: Preparation, Characterization, Properties, and Applications," International Journal of Corrosion, 2018, vol. 2018, 4749501, 19 pp.

* cited by examiner

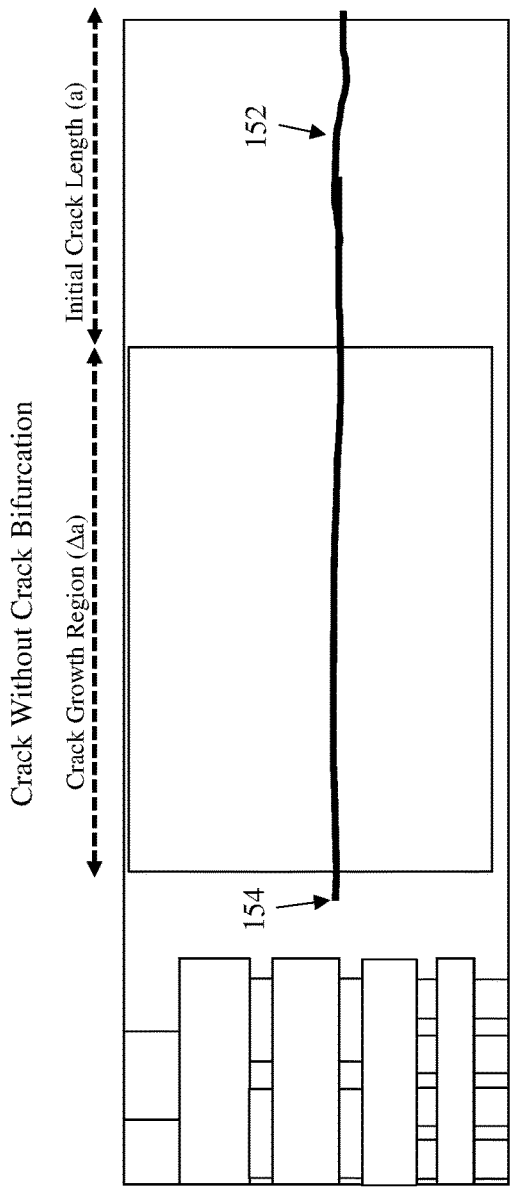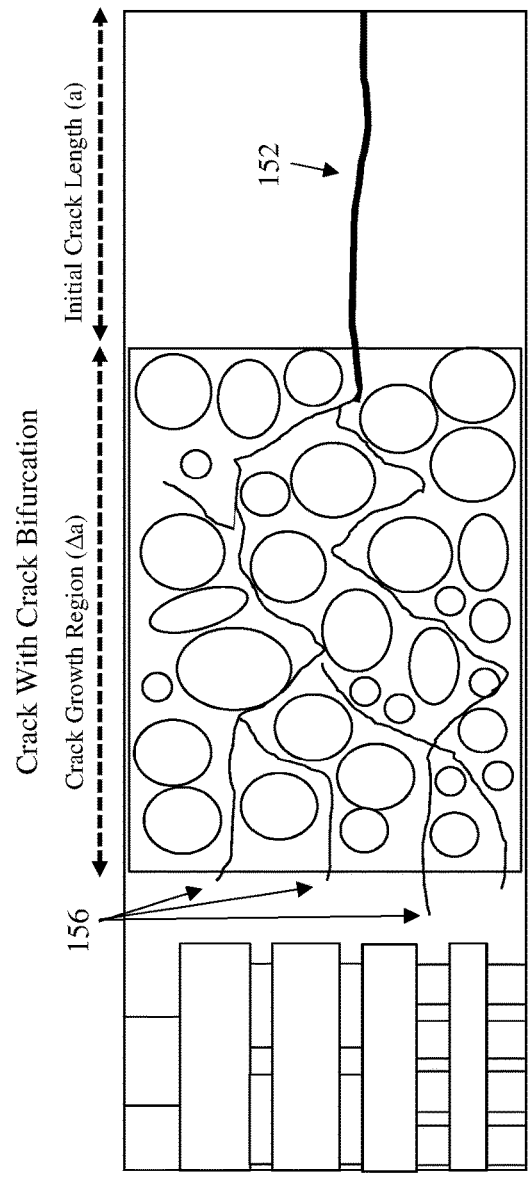

CRACK BIFURCATION IN BACK-END-OF-LINE

BACKGROUND

The present invention generally relates to fabrication methods and resulting structures for semiconductor devices, and more specifically, to providing an interlayer dielectric (ILD) crack bifurcation in semiconductor back-end-of-line (BEOL).

Integrated circuits are generally created by forming an array of electronic devices (i.e., transistors, diodes, resistors, capacitors, etc.) and interconnect wiring structures on a semiconductor substrate. Generally, semiconductor devices and gates are formed in a first layer during front-end-of-line (FEOL) processing, followed by formation of interconnect wiring structures in a second layer by BEOL processes. These first and second layers can each contain multiple layers of dielectric material which electrically isolate the devices and interconnect structures. Advanced semiconductor processes utilize dielectric materials with low dielectric constants (known as low-k materials) to minimize interconnect parasitic capacitances.

After a plurality of integrated circuits are formed on a semiconductor wafer, the semiconductor wafer is subjected to a wafer dicing process so as to divide the semiconductor wafer into a plurality of semiconductor chips. The semiconductor chip is then bonded to a substrate package. Due to the poor mechanical strength of the low-k dielectric materials, cracks can form and propagate through the BEOL dielectrics toward the active area of the chip during the wafer dicing and bonding processes, causing chip failure.

SUMMARY

Embodiments of the invention are directed to a method for providing an ILD crack bifurcation in the semiconductor BEOL. A non-limiting example of the method includes forming a crack stop over a substrate. The crack stop can span one or more dielectric layers. A topologically interlocking composite structure is formed adjacent to the crack stop and over the substrate. The topologically interlocking composite structure spans the one or more dielectric layers. A capping film is formed over the topologically interlocking composite structure and one or more metal interconnect layers are formed over the capping film. The composite structure includes a bulk matrix material and embedded inclusions. To promote crack bifurcation, materials of the inclusions and bulk matrix material are selected to ensure that the Young's modulus of the inclusions is greater than the Young's modulus of the bulk matrix material.

Embodiments of the invention are directed to a method for providing an ILD crack bifurcation in the semiconductor BEOL. A non-limiting example of the method includes forming a crack stop over a substrate. The crack stop can span one or more dielectric layers. A cap layer is formed over the crack stop and a trench is formed in the one or more dielectric layers to expose a surface of the substrate. The method includes forming a liner in the trench on the exposed surface of the substrate and on sidewalls of the one or more dielectric layers. The liner includes a superconformal (SC) silicon nitride film. A nanocomposite coating is deposited in the trench. The nanocomposite coating includes a bulk matrix material and a plurality of embedded inclusions. The nanocomposite coating is planarized to a surface of the cap layer.

Embodiments of the invention are directed to a semiconductor structure. A non-limiting example of the semiconductor device includes a crack stop over a substrate. The crack stop spans one or more dielectric layers. A topologically interlocking composite structure is adjacent to the crack stop and over the substrate. The topologically interlocking composite structure also spans the one or more dielectric layers. The topologically interlocking composite structure includes a nanocomposite coating having a bulk matrix material and a plurality of embedded inclusions. A cap layer is formed over the topologically interlocking composite structure and one or more metal interconnect layers are formed over the cap layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a crack propagation without crack bifurcation according to one or more embodiments of the invention;

FIG. 1B depicts a crack propagation with crack bifurcation according to one or more embodiments of the invention;

Figure 2:
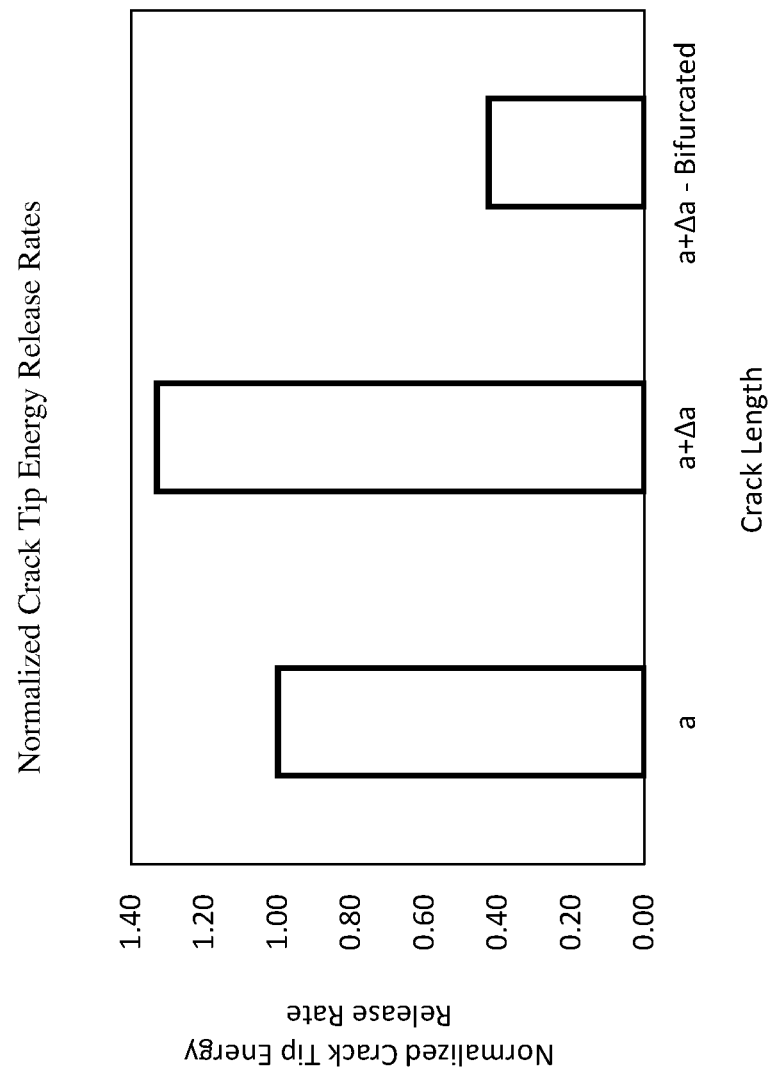
FIG. 2 depicts normalized crack tip energy release rates according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, crack stops are physical structures that are incorporated into a semiconductor wafer to enhance the mechanical strength of a BEOL dielectric. A crack stop serves to prevent any cracks in a wafer (e.g., an interlayer dielectric crack formed during a laser ablation) from damaging the active devices positioned behind the crack stop. Crack stops are usually sufficient to protect active devices from the microscopic cracks which occur due to the "weak" dielectric cohesive strength of low-k materials.

A problem arises when these microscopic cracks coalesce to form macroscopic cracks. The coalescence of microscopic cracks can occur due to a number of factors, including environmental conditions, packaging stresses, the weak dielectric cohesive strength, the weak dielectric to etch stop material adhesive strength, etc., and moisture absorption exacerbates the abovementioned phenomenon. Macroscopic cracks can cause a crack stop breach due to insufficient crack stop strength or a progressive crack stop strength degradation (due to moisture exposure over time, etc.). A macroscopic crack is stopped by a crack stop only if the energy release rate at the crack tip is less than the critical energy release rate of the crack stop. Conventional crack stop systems address this issue by increasing the strength of the actual crack stop. However, a strong crack stop will not guarantee that a crack will be stopped, as the crack can deflect under the crack stop.

Turning now to an overview of aspects of the present invention, one or more embodiments of the invention address the above-described shortcomings of the prior art by providing a new crack stop system and a method for providing an interlayer dielectric (ILD) crack bifurcation in semiconductor back-end-of-line (BEOL). This new crack stop system supplements a crack stop with topologically interlocking composite structures that create crack bifurcations. The composite structures are made of a plurality of inclusions dispersed in a dielectric medium (e.g., a low-k material).

As mentioned before, a crackstop breach is prevented only when the energy release rate at the tip of an advancing crack is lower than the critical energy release rate of the crackstop. Traditional methods in the field of crackstop design have employed structural enhancements within the crackstop to achieve an increase in the critical strength. However, an alternative method to tackle this problem is to reduce the energy release rate of the advancing crack itself. The energy release rate of an advancing crack depends on the crack length and driving force.

Referring to FIGS. 1A (crack without crack bifurcation), 1B (crack with crack bifurcation), 2 (normalized crack tip energy release rates) and 3 (normalized energy release rates for various materials), a macroscopic crack 152 has an initial crack length 'a' and an initial relative energy release rate of 1.0. If allowed to propagate as is (as shown in FIG. 1A), the energy release rate at the crack tip 154 after advancing a hypothetical distance of Aa increases by about 30%. An embodiment of the current invention proposes a method of creating crack bifurcations and breaks up the relatively large macroscopic crack 152 into several smaller cracks 156, as seen in FIG. 1B. As shown in FIG. 2, the result is an average reduction in the energy release rate of the propagated cracks (cracks 156) of about 60% for the same propagation distance of Aa.

Figure 4:
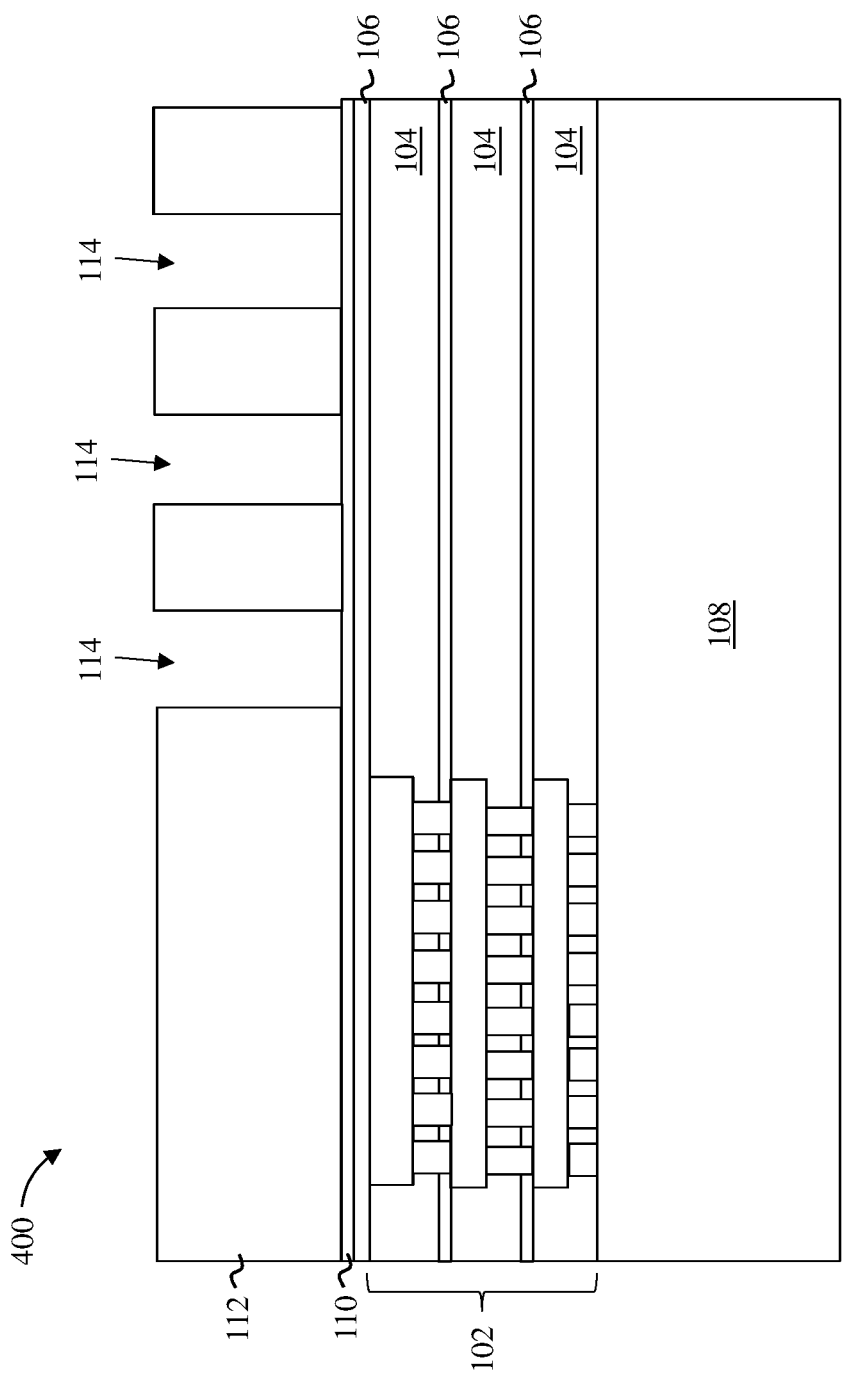
FIG. 4 depicts a cross-sectional view of a semiconductor structure after a processing operation according to one or more embodiments of the invention.

Turning now to a more detailed description of aspects of the present invention, FIG. 4 depicts a cross-sectional view of a semiconductor structure 400 during an intermediate operation of a method of fabricating a final semiconductor device according to one or more embodiments of the invention. In the embodiment shown in FIG. 4, the semiconductor structure 400 includes one or more metal interconnects 102 (collectively referred to as a crack stop) formed in one or more interlayer dielectric (ILD) layers 104. In some embodiments of the invention, one or more cap layers 106 (e.g., post copper CMP cap layers, also referred to as capping films) are formed on the one or more ILD layers 104. In some embodiments of the invention, the cap layers 106 can include a carbon doped silicon nitride, for example, SiCHN. In some embodiments of the invention, a sacrificial hard mask 110 is formed over the one or more cap layers 106. In some embodiments of the invention, the hard mask 110 is a sacrificial silicon dioxide hard mask. The hard mask 110 allows for lithographic rework if needed without affecting the post CMP cap layer (the cap layers 106). The hard mask 110 is not part of the final structure and thus is sacrificial.

In some embodiments of the invention, the metal interconnects 102 include various vias and lines made of any suitable conducting material, such as, for example, metal (e.g., tungsten, titanium, tantalum, ruthenium, zirconium, cobalt, copper, aluminum, gold, silver), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the contacts or lines include copper, cobalt, or tungsten. The conductive material can further include dopants that are incorporated during or after deposition. In some embodiments of the invention, the contacts or lines can include a barrier metal liner (not shown). Material examples include tantalum nitride and tantalum (TaN and Ta), titanium, titanium nitride, cobalt, ruthenium, and manganese. In some embodiments of the invention, the metal interconnects 102 are disposed over an underlying semiconductor substrate 108 (e.g., a silicon substrate).

The ILD layers 104 can be made of any suitable dielectric material, such as, for example, porous silicates (e.g., ULK2.55), carbon doped oxides, silicon dioxides, silicon nitrides, silicon oxynitrides, silicon carbide (SiC), octamethylcyclotetrasiloxane (OMCTS), dense low-k dielectrics, or other dielectric materials. Any known manner of forming the ILD layers 104 can be utilized, such as, for example, chemical vapor deposition (CVD), plasma-enhanced CVD (PECVD), atomic layer deposition (ALD), flowable CVD, spin-on dielectrics, or physical vapor deposition (PVD).

In some embodiments of the invention, cap layers 106 can be formed over each of the ILD layers 104. The cap layers 106 can be made of, for example, SiCHN, SiN, a bilayer of SiCHN/SiN, ODC (oxygen doped SiC or SiOC), or an aluminum oxy-nitride (AlON) ODC bilayer. Any known manner of forming cap layers 106 can be utilized, such as, for example, CVD, PECVD, ALD, flowable CVD, spin-on dielectrics, or PVD. In some embodiments of the invention, the cap layers 106 are formed to a thickness of 20 nm, although other thicknesses are within the contemplated scope of the invention.

In some embodiments of the invention, a hard mask 110 can be formed over the topmost layer of the cap layers 106. In some embodiments of the invention, the hard mask 110 can be made of an oxide, such as, for example, $SiO_2$. Any known manner of forming the hard masks 110 can be utilized, such as, for example, CVD, PECVD, ALD, flowable CVD, spin-on dielectrics, or PVD. In some embodiments of the invention, the hard mask 110 is formed to a thickness of 10 nm, although other thicknesses are within the contemplated scope of the invention.

In some embodiments of the invention, a photoresist stack 112 is formed over the hard mask 110. The photoresist stack 112 can be a bi-layer stack, a tri-layer stack, or a multilayer stack having a topmost photoresist layer.

In some embodiments of the invention, the photoresist stack 112 is a tri-layer stack having an organic planarization layer (OPL), an antireflective coating, and a photoresist (not shown). Patterning film stacks typically include OPLs because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows.

The OPL can be formed over a surface of the hard mask 110. In some embodiments of the invention, the OPL can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL can include any organic polymer and a photo-active compound having a molecular structure that can attach to the molecular structure of the organic polymer. In some embodiments of the invention, the OPL material is selected to be compatible with the overlying antireflective coating, the overlying photoresist, and the lithographic wavelength employed (i.e., ArF, KrF, etc.). In some embodiments, the OPL can be applied using, for example, spin coating technology.

The antireflective coating can be made of any suitable antireflective material, such as, for example, a low temperature oxide (LTO), SiARC, TiARC, or SiON. In some embodiments of the invention, the antireflective coating is SiARC. The antireflective coating can be deposited using, for example, a spin-on process. In some embodiments of the invention, the antireflective coating is deposited to a thickness of about 0.5 to about 5 nm, although other thicknesses are within the contemplated scope of the invention.

The photoresist can include any suitable photoresist material, such as, for example, 248 nm resists, 193 nm resists, 157 nm resists, or EUV (extreme ultraviolet) resists. In some embodiments of the invention, the photoresist can be made of a light sensitive polymer, and can be deposited using any suitable resist process, such as spin-on coating. As depicted in FIG. 4, the photoresist stack 112 can be lithographically exposed to a crack bifurcation trench pattern. Portions of the photoresist stack 112 can be removed to define one or more trenches 114 exposing a surface of the hard mask 110.

While FIG. 4 is depicted with three trenches 114 for ease of illustration, it is understood that any number of trenches can be formed in this manner. In some embodiments of the invention, 1, 2, 3, 4, 5, 6, 7, 8, 9, 10, 15, 20, 50, 100, or any other number of trenches can be formed. Moreover, while the width of each of the trenches 114 can be the same, or approximately the same (within lithographic tolerances), each of the trenches 114, or any subset of the trenches 114, can be formed having a different width. In this manner, both the number of composite structures (FIG. 4) and their widths can be varied to the specific needs of a particular application.

Figure 5:
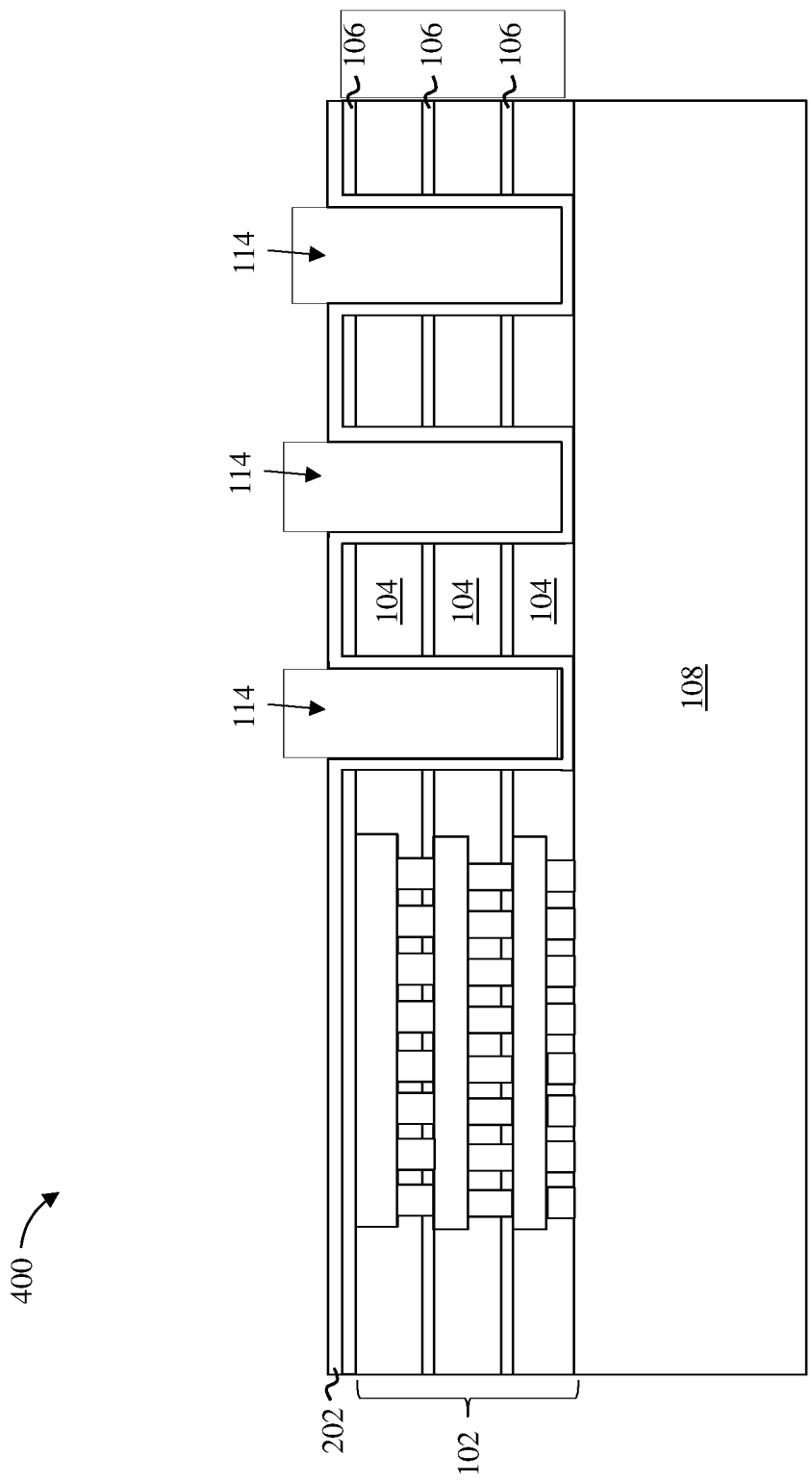
FIG. 5 depicts a cross-sectional view of a semiconductor structure after a processing operation according to one or more embodiments of the invention.

FIG. 5 depicts a cross-sectional view of the semiconductor structure 400 after a processing operation according to one or more embodiments of the invention. As illustrated in FIG. 5, portions of the hard mask 110, cap layers 106, and ILD layers 104 can be removed to extend the one or more trenches 114 into the semiconductor structure 102. In some embodiments of the invention, the one or more trenches 114 are extended until a surface of the substrate 108 is exposed. In some embodiments of the invention, the one or more trenches 114 are extended into and beyond the surface of the substrate 108. The hard mask 110, cap layers 106, and ILD layers 104 can be removed (where the photoresist is opened) using, for example, a wet etch, a dry etch, or a combination of wet and/or dry etches. In some embodiments of the invention, the hard mask 110, cap layers 106, and ILD layers 104 are removed using a RIE. In some embodiments of the invention, the one or more trenches 114 are formed to a width of about 4 to about 8 microns wide, although other widths are within the contemplated scope of the invention.

In some embodiments of the invention, the photoresist stack 112 is removed post-patterning. The photoresist stack 112 can be removed using, for example, a resist strip. The hard mask 110 is removed to expose a surface of the cap layers 106. The hard mask 110 can be a thin hard mask removed using, a wet etch, a dry etch, or a combination of wet and/or dry etches. For example, $SiO_2$ can be removed using a wet etchant such as dilute hydrofluoric acid (DHF).

As further depicted in FIG. 5, a liner 202 can be formed over the semiconductor structure 400. In some embodiments of the invention, the dielectric liner 202 is conformally deposited over the cap layers 106 and on sidewalls of the ILD layers 104 using, for example, ALD, although other conformal deposition processes are within the contemplated scope of the invention. The liner 202 can be made of a suitable dielectric material, such as, silicon nitride, silicon dioxide, SiON, and SiCN. A low-k dielectric such as SiOC can also be used where the dielectric constant is less than about 3.9.

In some embodiments of the invention, the liner 202 includes a superconformal (SC) thin nitride film. For example, the liner 202 can be formed to a nominal (conformal) thickness of about 10 nm or less, or 5 nm or less, although other thicknesses are within the contemplated scope of the invention.

Figure 6:
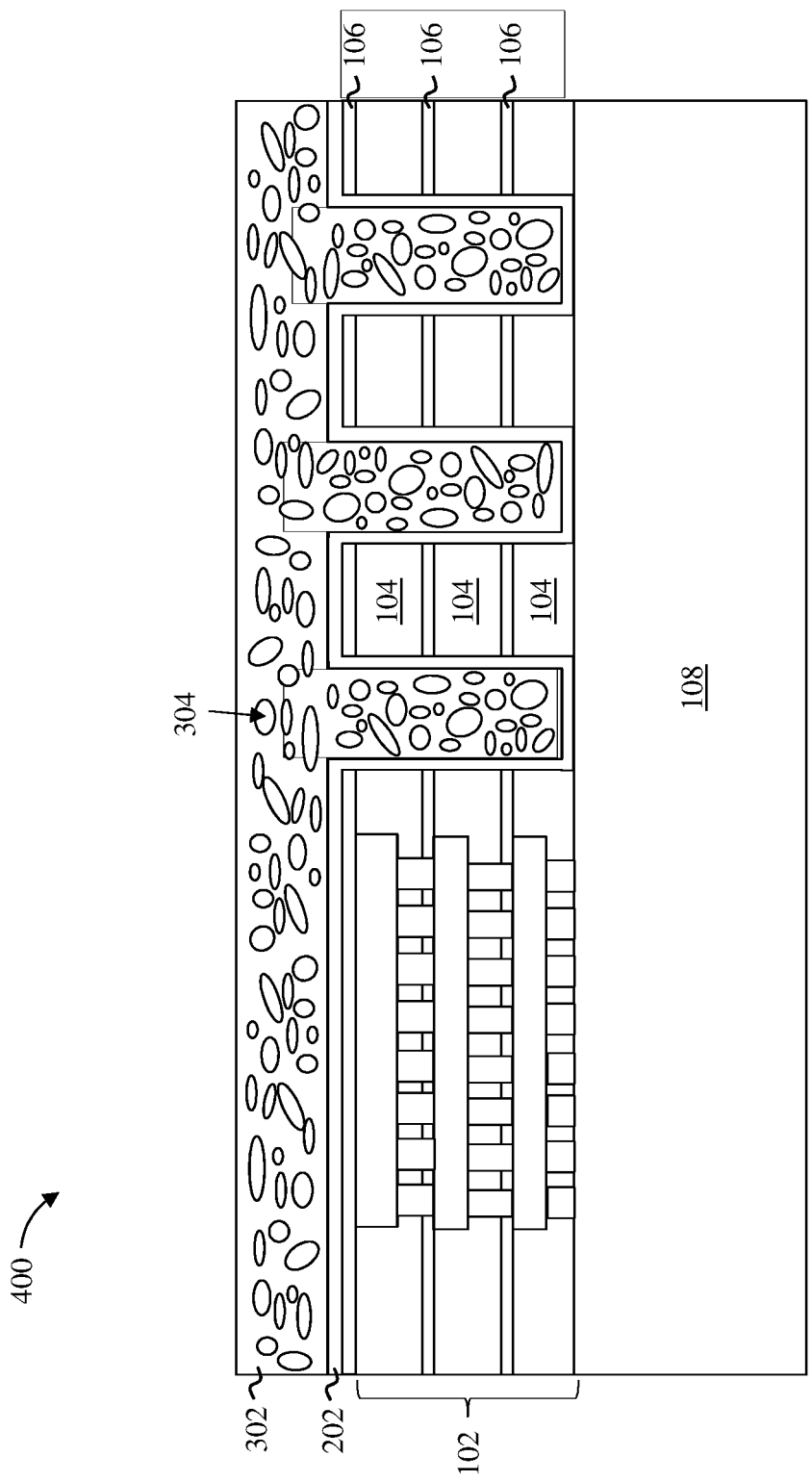
FIG. 6 depicts a cross-sectional view of a semiconductor structure after a processing operation according to one or more embodiments of the invention.

FIG. 6 depicts a cross-sectional view of the semiconductor structure 400 after a processing operation according to one or more embodiments of the invention. As illustrated in FIG. 6, the one or more trenches 114 can be filled with a nanocomposite coating 302 (also referred to as a topologically interlocking composite structure).

In some embodiments of the invention, the nanocomposite coating 302 includes a bulk matrix material (fill material) and a plurality of embedded inclusions 304. In some embodiments of the invention, the materials for the bulk matrix material and the inclusions 304 are selected to ensure or promote crack bifurcation.

Figure 3:
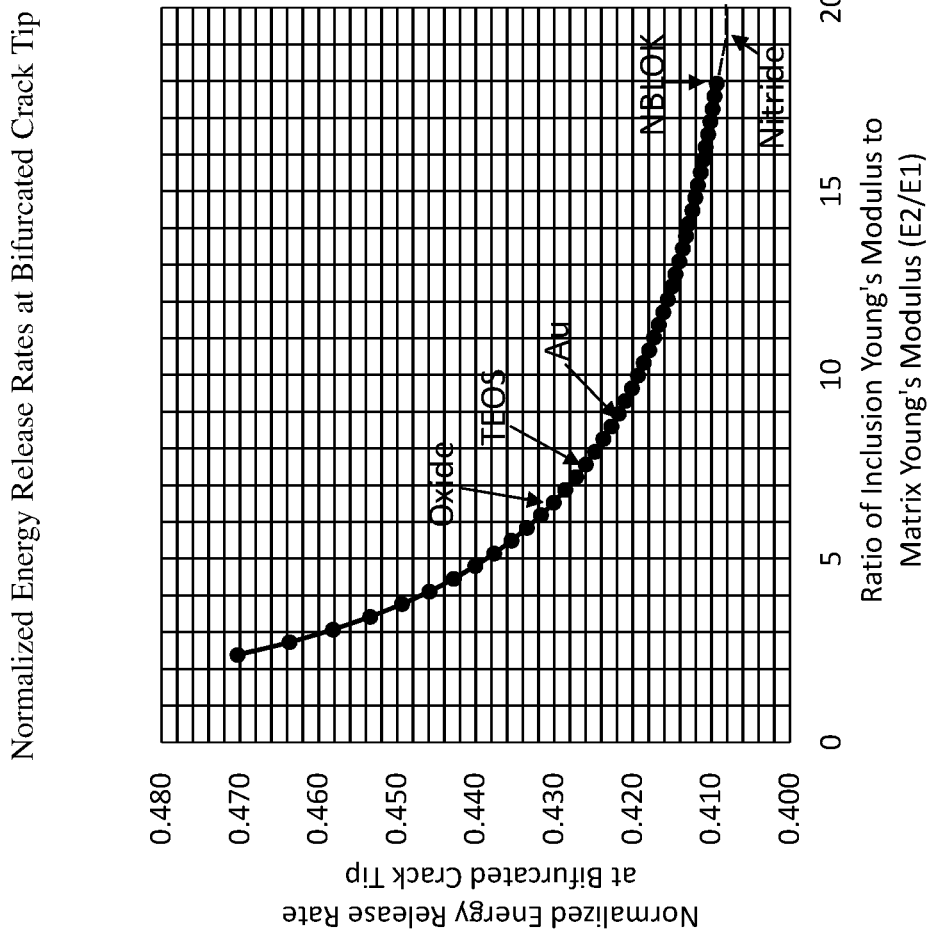
FIG. 3 depicts normalized energy release rates at bifurcated crack tips for various materials according to one or more embodiments of the invention.

To ensure or promote crack bifurcation, the Young's modulus of the inclusions 304 must be greater than the Young's modulus of the bulk matrix material. In some embodiments of the invention, the Young's modulus ratio $(E_2/E_1)$ is at least 2.0 (meaning that the Young's modulus of the inclusions 304 is an order of magnitude higher than the Young's modulus of the bulk matrix material) and can be in the range of 2.0 to 20. As shown in FIG. 3, for the same size distribution and packing density, the benefit of having inclusions asymptotes at a modulus ratio $E_2/E_1$ of about 20.

Options for the inclusions 304 fall generally into three categories: (i) 0D nanocomposite coatings (i.e., the fillers are nanoparticles having 3 dimensions in the nanometer scale); (ii) 1D nanocomposite coatings (i.e., the fillers are nanotubes or whiskers having 2 dimensions in the nanometer scale); or (iii) 2D nanocomposite coatings (i.e., the fillers are nanolayers having 1 dimension in the nanometer scale). For an overview of nanocomposite coatings, see, e.g., Nguyen et al. (2018). Nanocomposite Coatings: Preparation, Characterization, Properties and Applications. International Journal of Corrosion. 2018. 10.1155/2018/4749501.

For inorganic nanofillers, the types of nanoparticles can include carbides, nitrites, borides, oxides, metallic particles, clay, CNT, and nanodiamond. For organic nanoparticles (organic nanofiller), available nanoparticales include PTFE, PEO, PANi, or nanocellulose and cellulose nanocrystal.

Options for the bulk matrix material generally fall into four categories: (i) organic/inorganic (O/I) nanocomposite coatings; (ii) organic/organic (O/O) nanocomposite coatings; (iii) inorganic/organic (I/O) nanocomposite coatings; and (iv) inorganic/inorganic (I/I) nanocomposite coatings.

For an organic matrix, common polymers for the preparation of a nanocomposite coating can include, for example, epoxy, polyurethane, Chitosan, polyethylene glycol (PEG), polyvinylidene fluoride (PVDF), PANi, PPy, polystyrene, polyamic acid and polyimide, rubber-modified polybenzoxazine (PBZ), polymers containing reactive trimethoxysilyl (TMOS), pullulan, fluoroacrylic polymer, ethylene tetrafluoroethylene (ETFE), polyacrylate, poly(N-vinyl carbazole), polycarbonate, fluorinatedpolysiloxane, polyester, polyacrylic, polyvinylalcohol (PVA), polydimethylsiloxane, polyamide, and UV-curable polymers.

For an inorganic matrix, such as a metal matrix or alloymatrix, various preparation methods are available, including CVD, powder metallurgy, PVD, thermal plasma spray, sol-gel, epitaxial growth, cold spray, and electrodeposition. Metalmatrix composite coatings that dispersed a second phase offer some unique properties such as oxidation and corrosion resistance, wear resistance, and magnetic properties.

In some embodiments of the invention, the bulk matrix material can include any suitable dielectric material having a relatively low Young's modulus, for example, OMCTS having a Young's modulus $(E_1)$ of about 9.2 GPa. The inclusions 304 can include any suitable material having a relatively high Young's modulus (with respect to the bulk matrix material), for example, tetraethyl orthosilicate (TEOS) having a Young's modulus $(E_2)$ of about 70 GPa. In this manner, the Young's modulus ratio $(E_2/E_1)$ is about 7.61, although other ratios are within the contemplated scope of the invention.

In some embodiments of the invention, the inclusions 304 include a range of sizes, ranging from a size of 0.1 to 0.4 microns, although other sizes are within the contemplated scope of the invention. Moreover, while depicted as an unordered embedding, the inclusions 304 can also be constructed from well-defined geometric shapes (e.g., alternating triangles).

Figure 7:
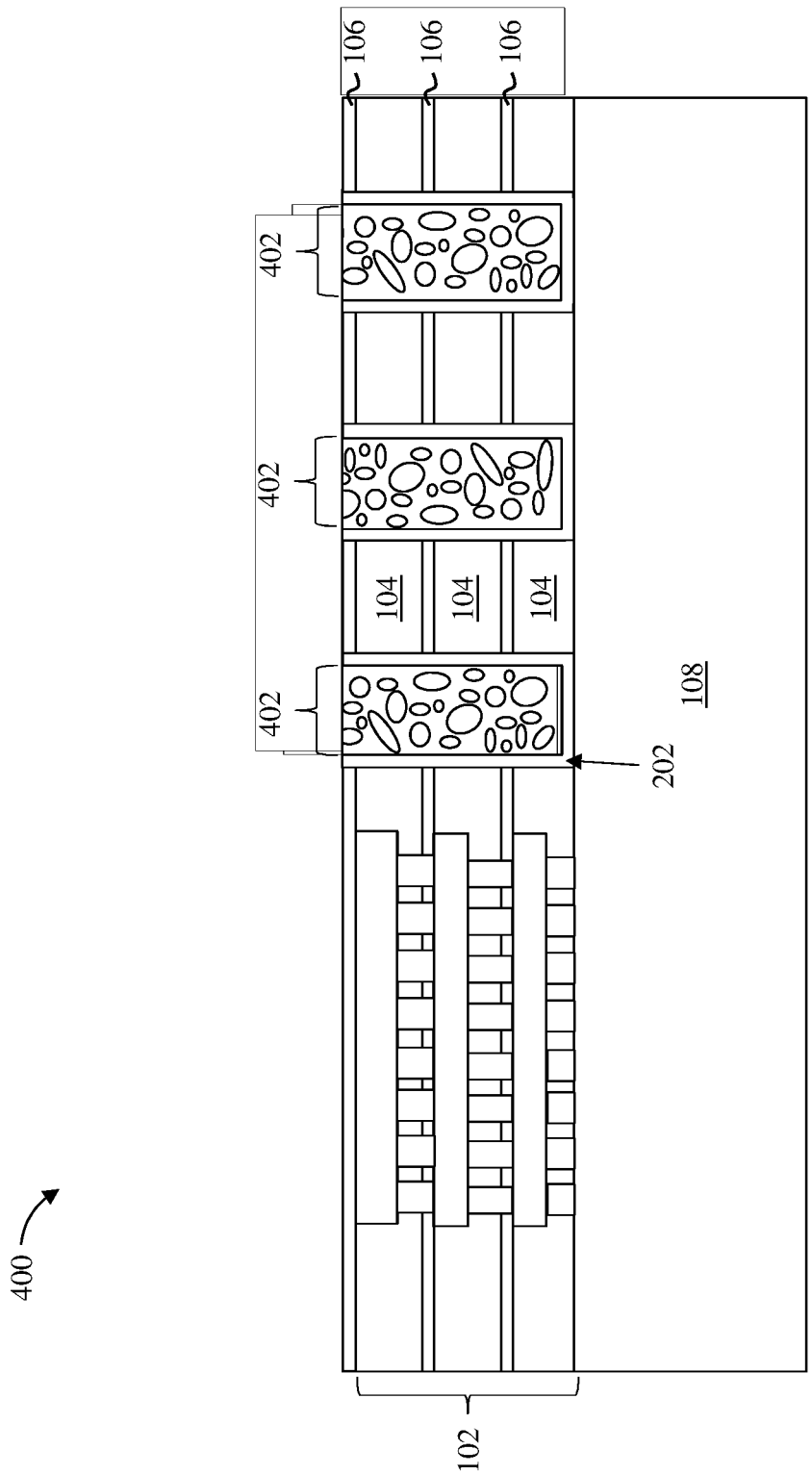
FIG. 7 depicts a cross-sectional view of a semiconductor structure after a processing operation according to one or more embodiments of the invention.

FIG. 7 depicts a cross-sectional view of the semiconductor structure 400 after a processing operation according to one or more embodiments of the invention. As illustrated in FIG. 7, the semiconductor structure 400 can be polished down to the cap layers 106 using, for example, chemical-mechanical planarization (CMP). In this manner, the nanocomposite coating 302 can be separated to define one or more topologically interlocking composite structures 402.

Figure 8:
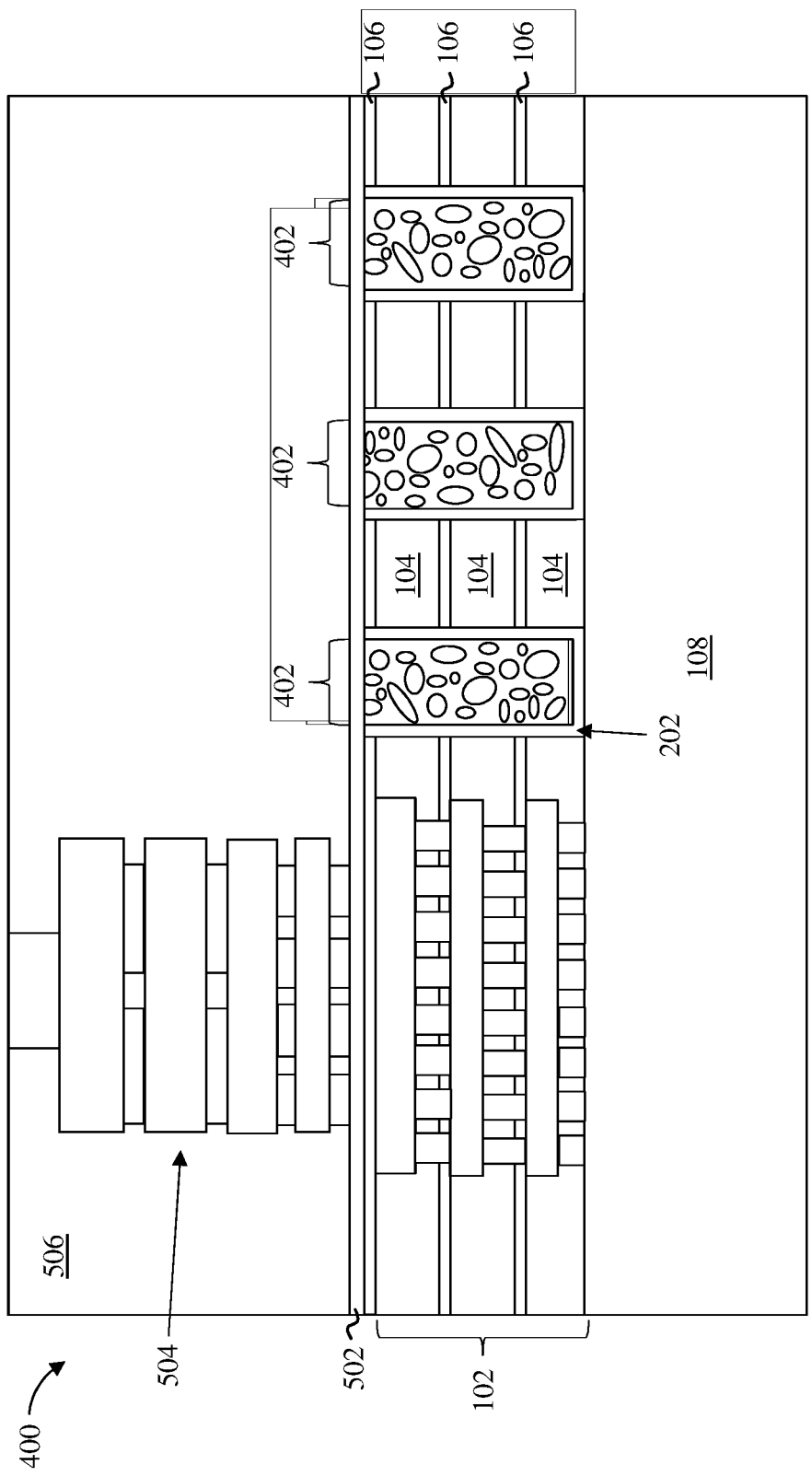
FIG. 8 depicts a cross-sectional view of a semiconductor structure after a processing operation according to one or more embodiments of the invention.

FIG. 8 depicts a cross-sectional view of the semiconductor structure 400 after a processing operation according to one or more embodiments of the invention. As illustrated in FIG. 8, a thin film 502 is formed over the cap layers 106 and the composite structures 402. The thin film 502 can be made of any suitable low dielectric constant capping material, such as, for example, SiCHN. Any known manner of forming thin film 502 can be utilized, such as, for example, CVD, PECVD, ALD, flowable CVD, spin-on dielectrics, or PVD. In some embodiments of the invention, the thin film 502 is formed to a thickness of 20 nm, although other thicknesses are within the contemplated scope of the invention.

In some embodiments of the invention, the BEOL and far-back-end-of-line (FBEOL) are completed after forming the thin film 502. In the embodiment shown in FIG. 8, the semiconductor structure 400 includes one or more additional metal interconnects 504 formed in one or more ILD layers 506. The additional metal interconnects 504 and the ILD layers 506 can be formed in a similar manner as the metal interconnects 102 and ILD layers 104 discussed previously herein. The additional metal interconnects 504 and the metal interconnects 102 can be collectively referred to as a crack stop.

Figure 9:
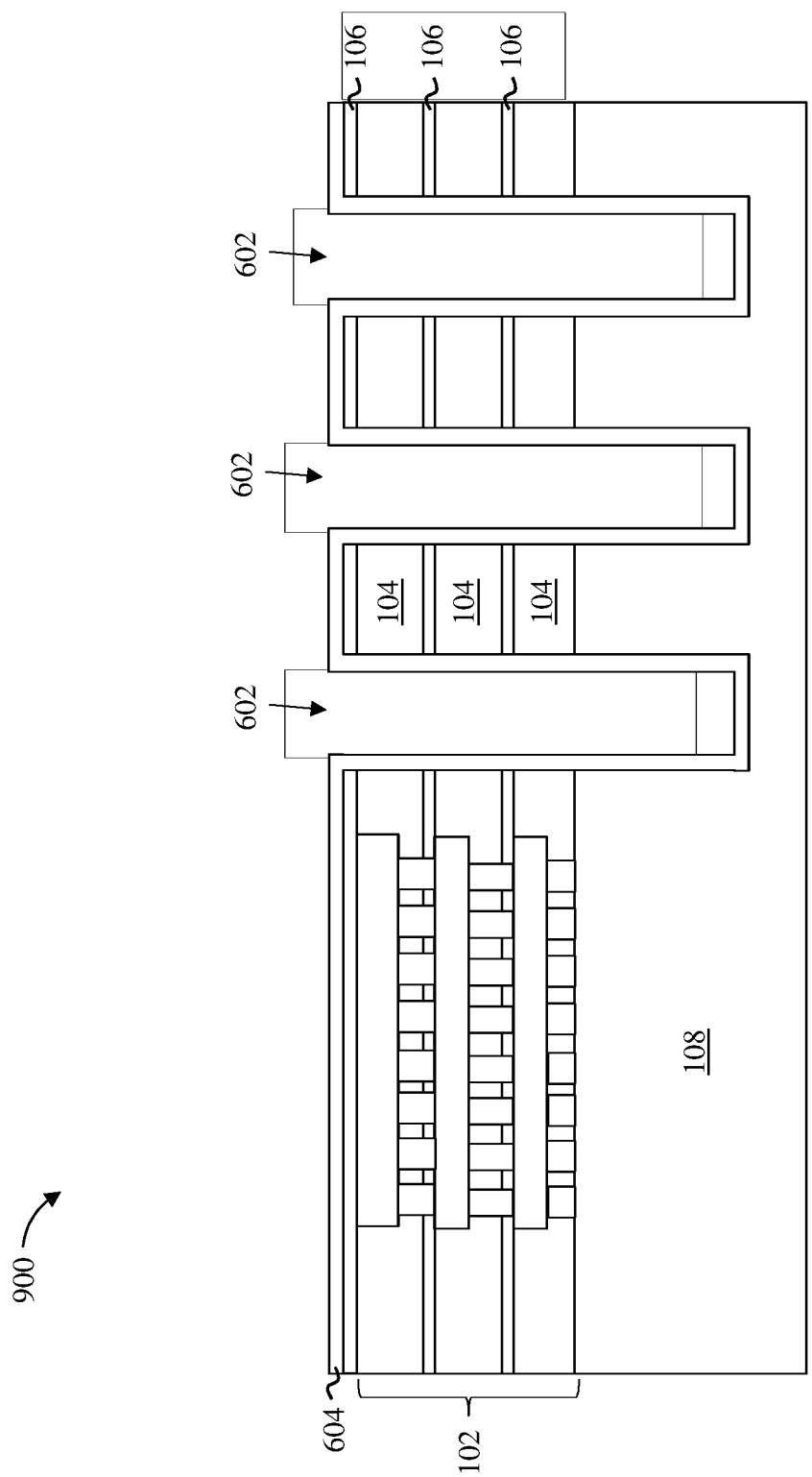
FIG. 9 depicts a cross-sectional view of a semiconductor structure after a processing operation according to one or more embodiments of the invention.

FIG. 9 depicts a cross-sectional view of a semiconductor structure 900 during an intermediate operation of a method of fabricating a final semiconductor device according to one or more embodiments of the invention. FIG. 9 illustrates an alternative embodiment to FIGS. 4-8, whereby portions of the hard mask 110, cap layers 106, ILD layers 104, and the substrate 108 are removed to form one or more extended trenches 602 recessed into the substrate 108. In some embodiments of the invention, the process operations depicted with respect to FIG. 9 follow those shown with respect to FIG. 4.

As further depicted in FIG. 9, a dielectric liner 604 can be formed over the semiconductor structure 400 and in the one or more extended trenches 602. In some embodiments of the invention, the liner 604 is conformally deposited over the cap layers 106 and on sidewalls of the ILD layers 104 using, for example, ALD, although other conformal deposition processes are within the contemplated scope of the invention. The liner 604 can be made of any suitable dielectric material, such as, silicon nitride, silicon dioxide, SiON, SiCN. A low-k dielectric such as SiOC can also be used where the dielectric constant is less than about 3.9. In some embodiments of the invention, the liner 604 includes a thin conformal nitride film. For example, the liner 604 can be formed to a nominal thickness of about 10 nm or less, or 5 nm or less, although other thicknesses are within the contemplated scope of the invention.

Figure 10:
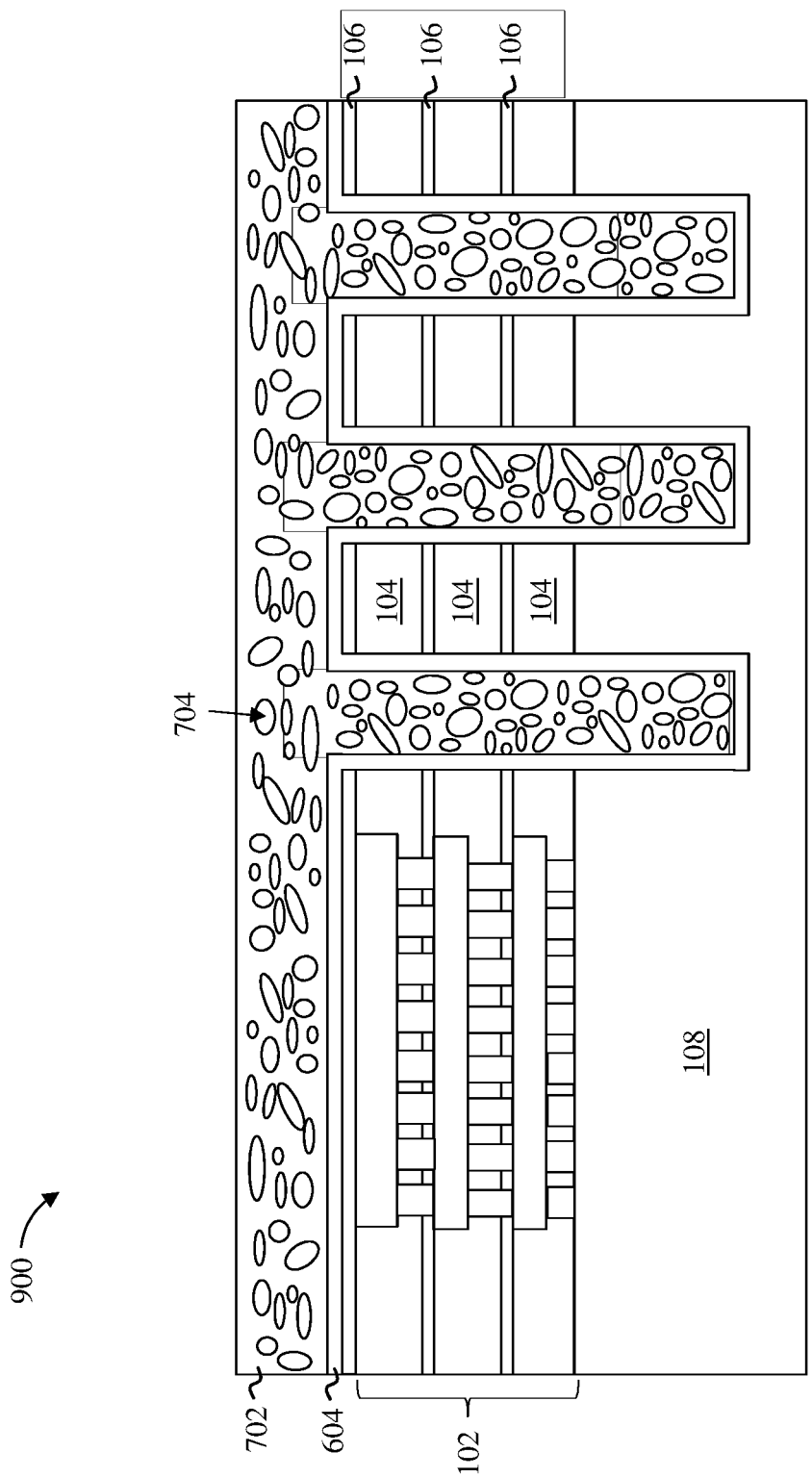
FIG. 10 depicts a cross-sectional view of a semiconductor structure after a processing operation according to one or more embodiments of the invention.

FIG. 10 depicts a cross-sectional view of the semiconductor structure 900 after a processing operation according to one or more embodiments of the invention. As illustrated in FIG. 10, the one or more extended trenches 602 can be filled with a nanocomposite coating 702 having inclusions 704. The nanocomposite 702 and inclusions 704 can be formed in a similar manner as the nanocomposite 302 and inclusions 304 described with respect to FIG. 9. Advantageously, forming the nanocomposite coating 702 having inclusions 704 within the extended trenches 602 can prevent cracks from bypassing under the nanocomposite coating 702.

Figure 11:
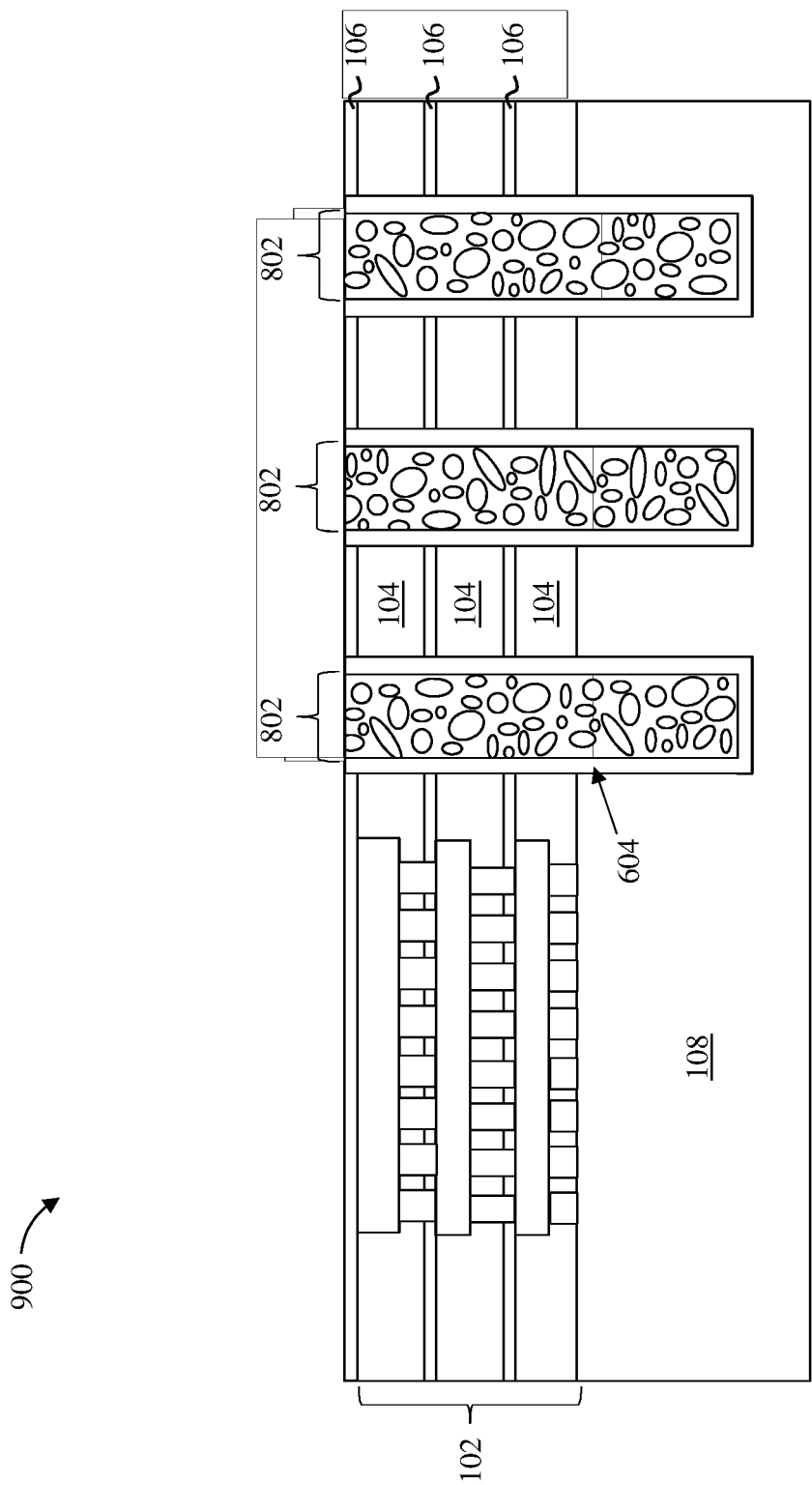
FIG. 11 depicts a cross-sectional view of a semiconductor structure after a processing operation according to one or more embodiments of the invention.

FIG. 11 depicts a cross-sectional view of the semiconductor structure 900 after a processing operation according to one or more embodiments of the invention. As illustrated in FIG. 11, the semiconductor structure 900 can be polished down to the cap layers 106 using, for example, chemical-mechanical planarization (CMP). In this manner, the nanocomposite coating 702 can be separated to define one or more topologically interlocking composite structures 802.

Figure 12:
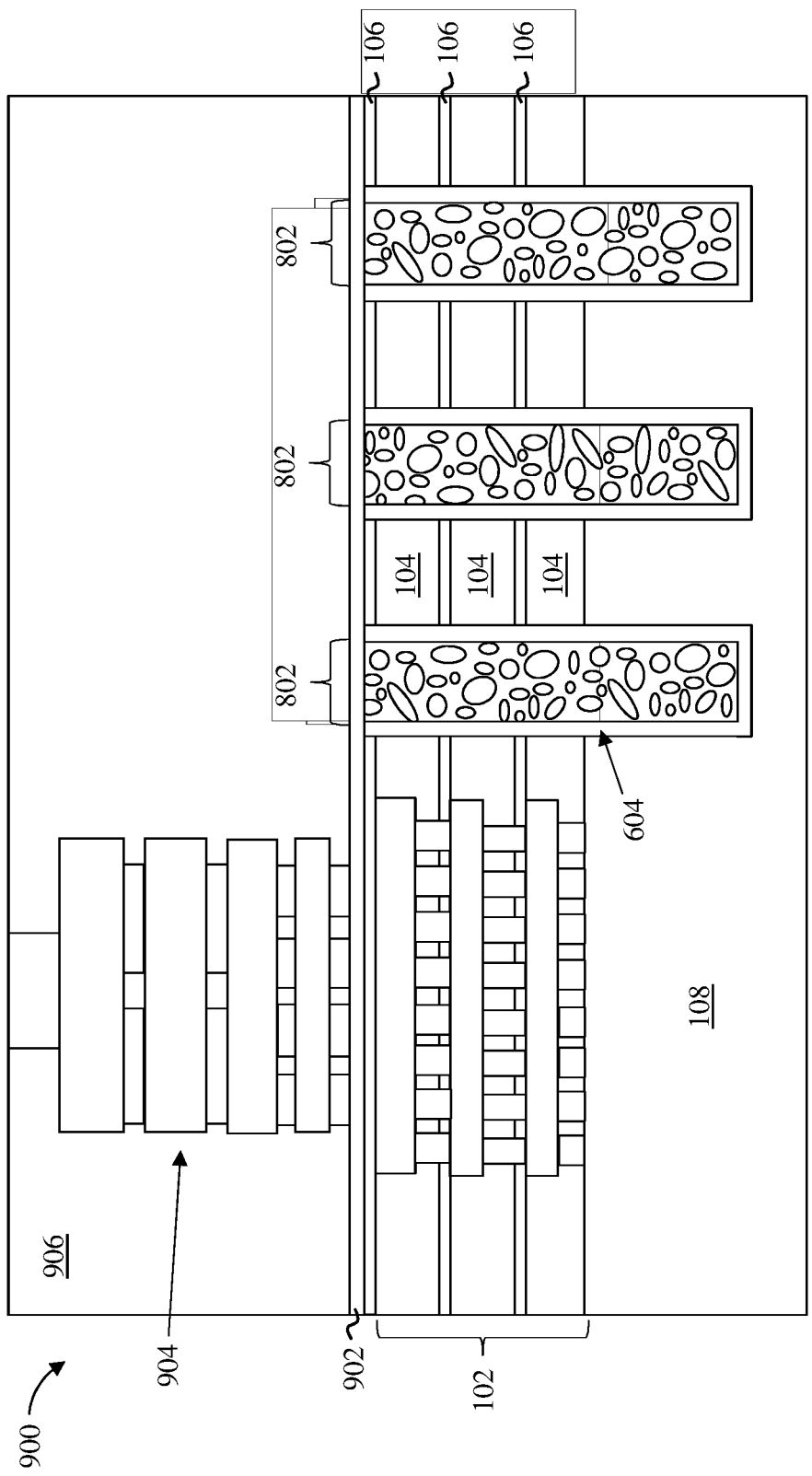
FIG. 12 depicts a cross-sectional view of a semiconductor structure after a processing operation according to one or more embodiments of the invention.

FIG. 12 depicts a cross-sectional view of the semiconductor structure 900 after a processing operation according to one or more embodiments of the invention. As illustrated in FIG. 12, a low dielectric constant cap film 902 can be formed over the cap layers 106 and the composite structures 802. The cap film 902 can be made of any suitable low dielectric constant capping material, such as, for example, SiCHN. Any known manner of forming cap film 902 can be utilized, such as, for example, CVD, PECVD, ALD, flowable CVD, spin-on dielectrics, or PVD. In some embodiments of the invention, the cap film 902 is formed to a thickness of 20 nm, although other thicknesses are within the contemplated scope of the invention.

In some embodiments of the invention, the BEOL and FBEOL are completed after forming the hard mask 902. In the embodiment shown in FIG. 12, the semiconductor structure 900 includes one or more additional metal interconnects 904 formed in one or more ILD layers 906. The additional metal interconnects 904 and the ILD layers 906 can be formed in a similar manner as the metal interconnects 102 and ILD layers 104 discussed previously herein.

Figure 13:
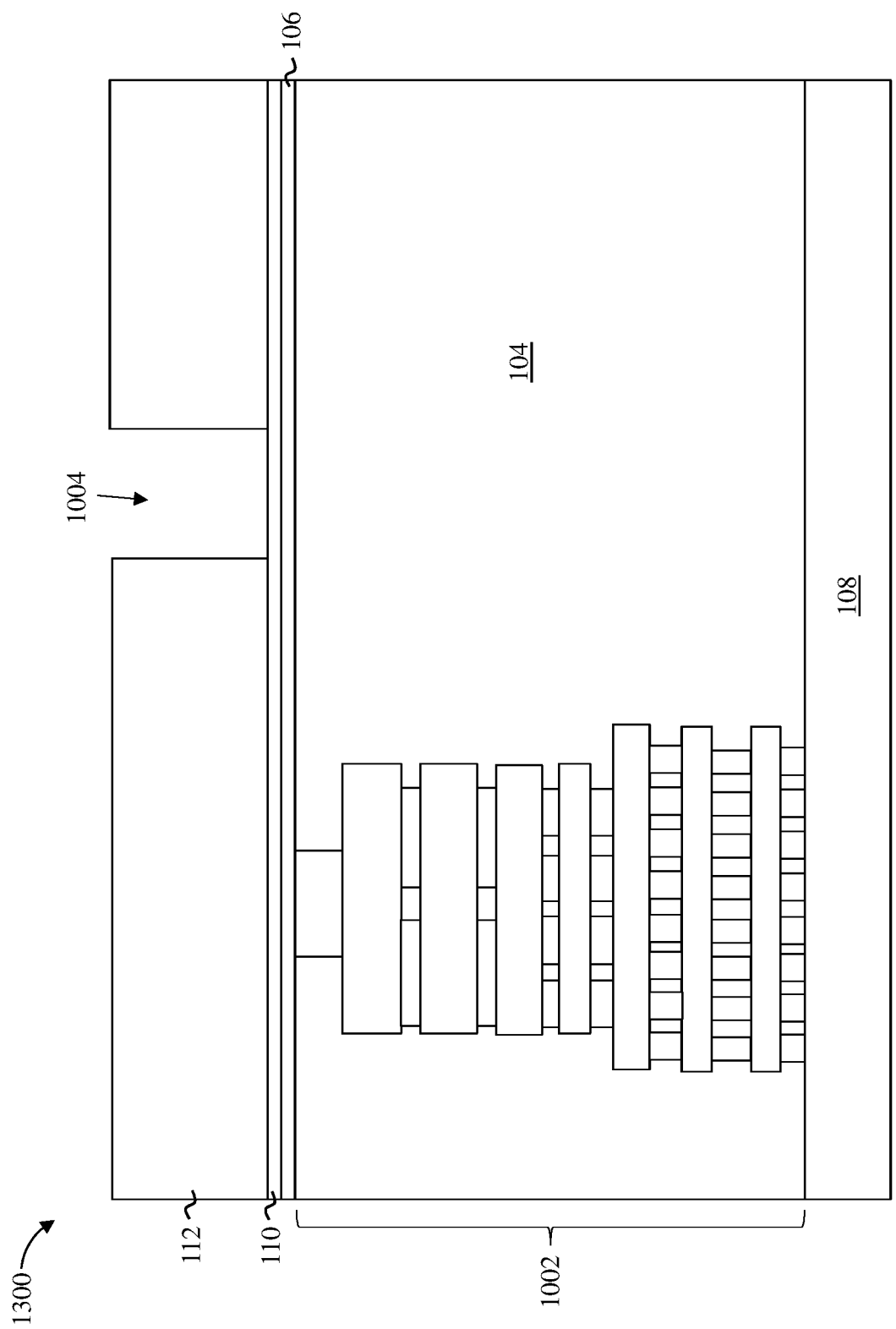
FIG. 13 depicts a cross-sectional view of a semiconductor structure after a processing operation according to one or more embodiments of the invention.

FIG. 13 depicts a cross-sectional view of a semiconductor structure 1300 during an intermediate operation of a method of fabricating a final semiconductor device according to one or more embodiments of the invention. FIG. 13 illustrates an alternative embodiment to FIGS. 4-8, whereby the hard mask 110 and the photoresist stack 112 are formed after the last metallization layer of metal interconnects 1002 (collectively referred to as a crack stop). In other words, the hard mask 110 is formed on the topmost layer of the metal interconnects 1002. Portions of the photoresist stack 112 can be removed to define one or more trenches 1004 exposing a surface of the hard mask 110, in a similar manner as described previously herein with respect to the trenches 114.

Figure 14:
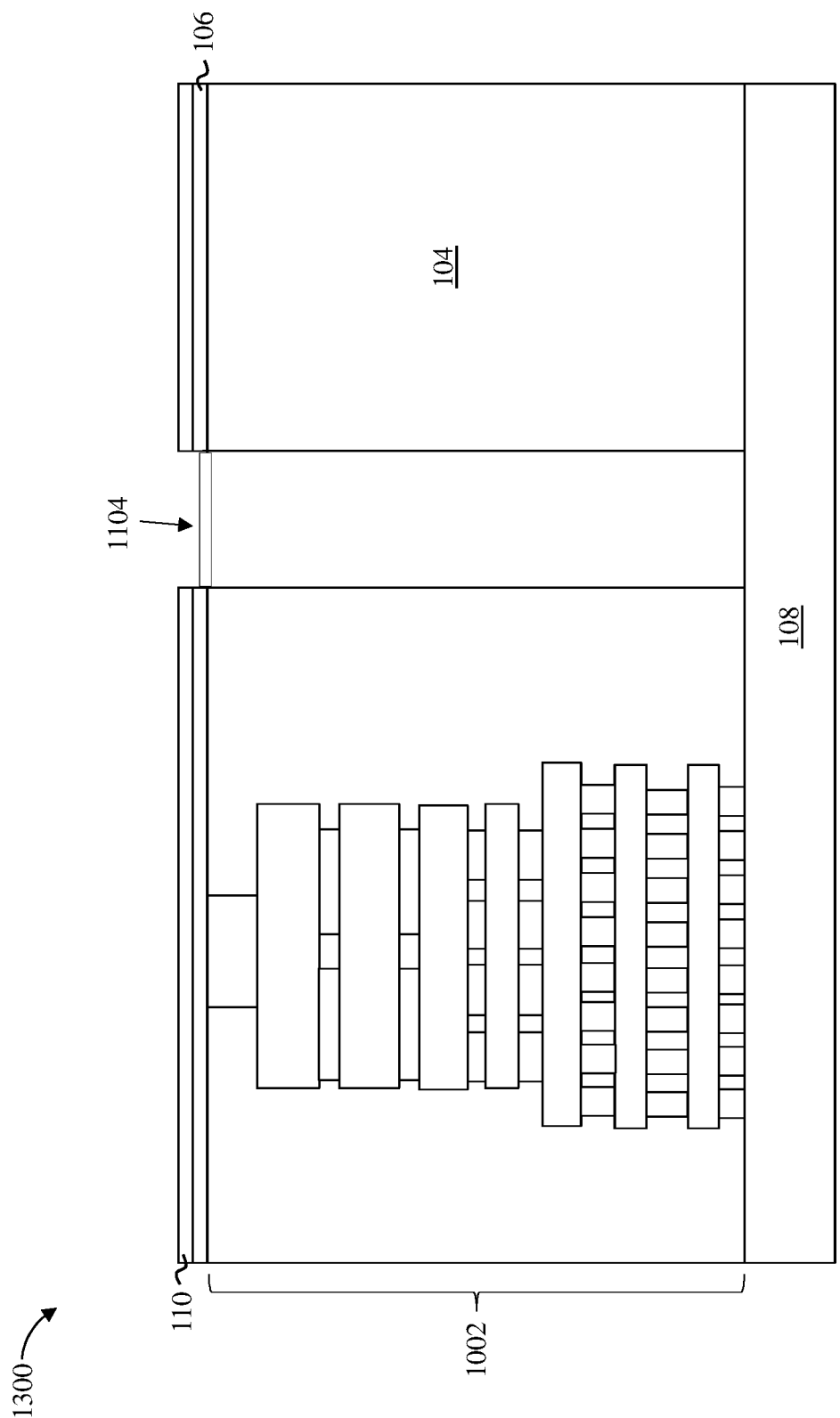
FIG. 14 depicts a cross-sectional view of a semiconductor structure after a processing operation according to one or more embodiments of the invention.

FIG. 14 depicts a cross-sectional view of the semiconductor structure 1300 after a processing operation according to one or more embodiments of the invention. As illustrated in FIG. 14, portions of the hard mask 110, cap layers 106, and ILD layers 104 are removed to form one or more trenches 1104. In some embodiments of the invention, the trenches 1104 are formed in a similar manner as the trenches 114 discussed previously herein with respect to FIGS. 4-8 (e.g., the trenches 1104 can sit on a surface of the substrate 108). In some embodiments of the invention, the trenches 1104 are formed in a similar manner as the trenches 602 discussed previously herein with respect to FIGS. 9-12 (e.g., portions of the substrate 108 can be recessed to allow the trenches 1104 to extend into the substrate 108). In some embodiments of the invention, the hard mask 110 is a sacrificial hard mask that is removed in the final structure in a similar manner as discussed previously herein with respect to FIGS. 4-8.

Figure 15:
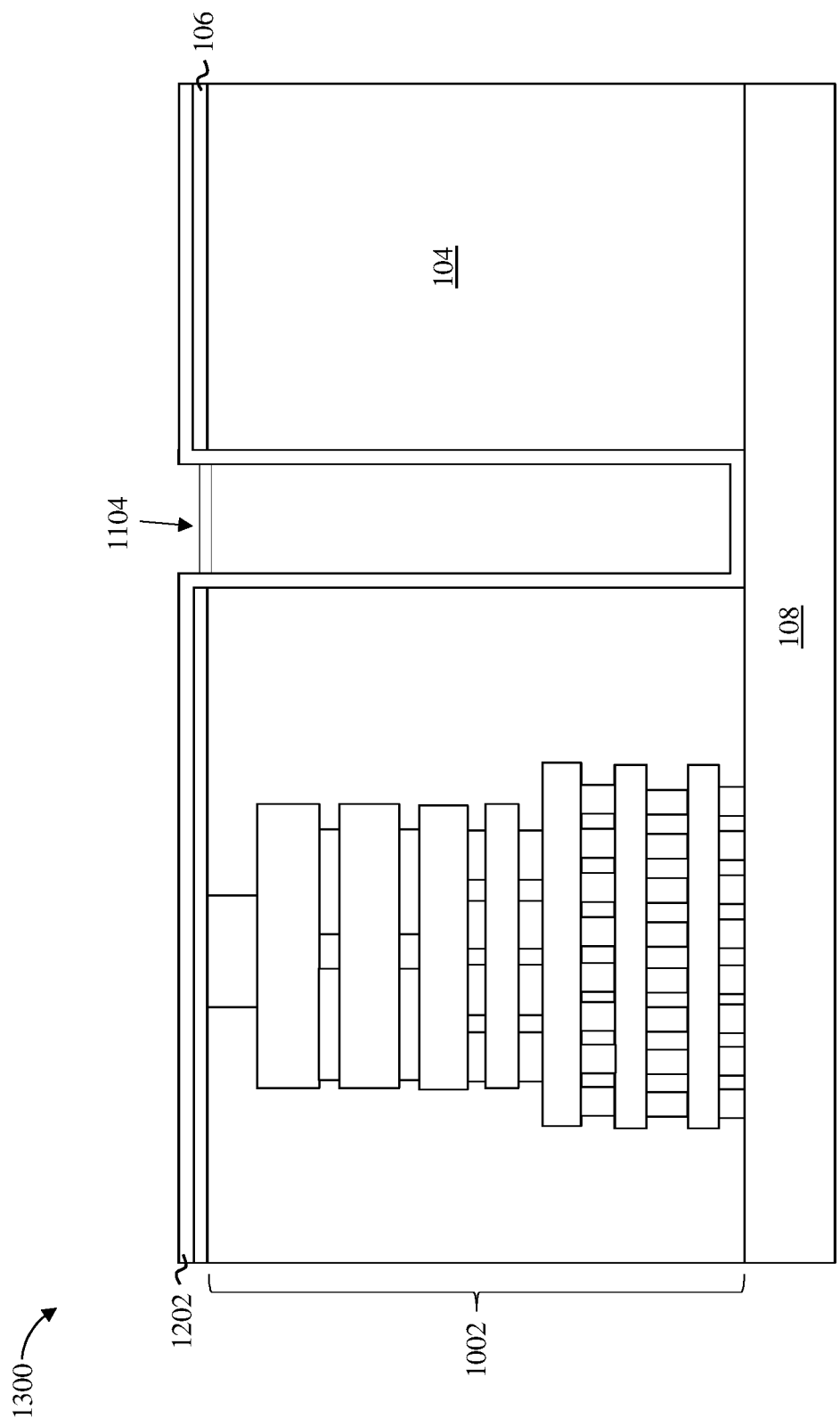
FIG. 15 depicts a cross-sectional view of a semiconductor structure after a processing operation according to one or more embodiments of the invention.

FIG. 15 depicts a cross-sectional view of the semiconductor structure 1300 after a processing operation according to one or more embodiments of the invention. As illustrated in FIG. 15, a dielectric liner 1202 can be formed over the semiconductor structure 1300 and in the one or more trenches 1104. In some embodiments of the invention, the hard mask 110 is removed and the liner 1202 is conformally deposited over the cap layers 106 and on sidewalls of the ILD layers 104 using, for example, ALD, although other conformal deposition processes are within the contemplated scope of the invention. The liner 1202 can be made of any suitable dielectric material, such as, for example, a low-k dielectric, a nitride, silicon nitride, silicon oxide, SiON, SiC, SiOCN, or SiBCN. In some embodiments of the invention, the liner 1202 includes a thin nitride film. For example, the liner 1202 can be formed to a nominal (conformal) thickness of about 10 nm or less, or 5 nm or less, although other thicknesses are within the contemplated scope of the invention.

Figure 16:
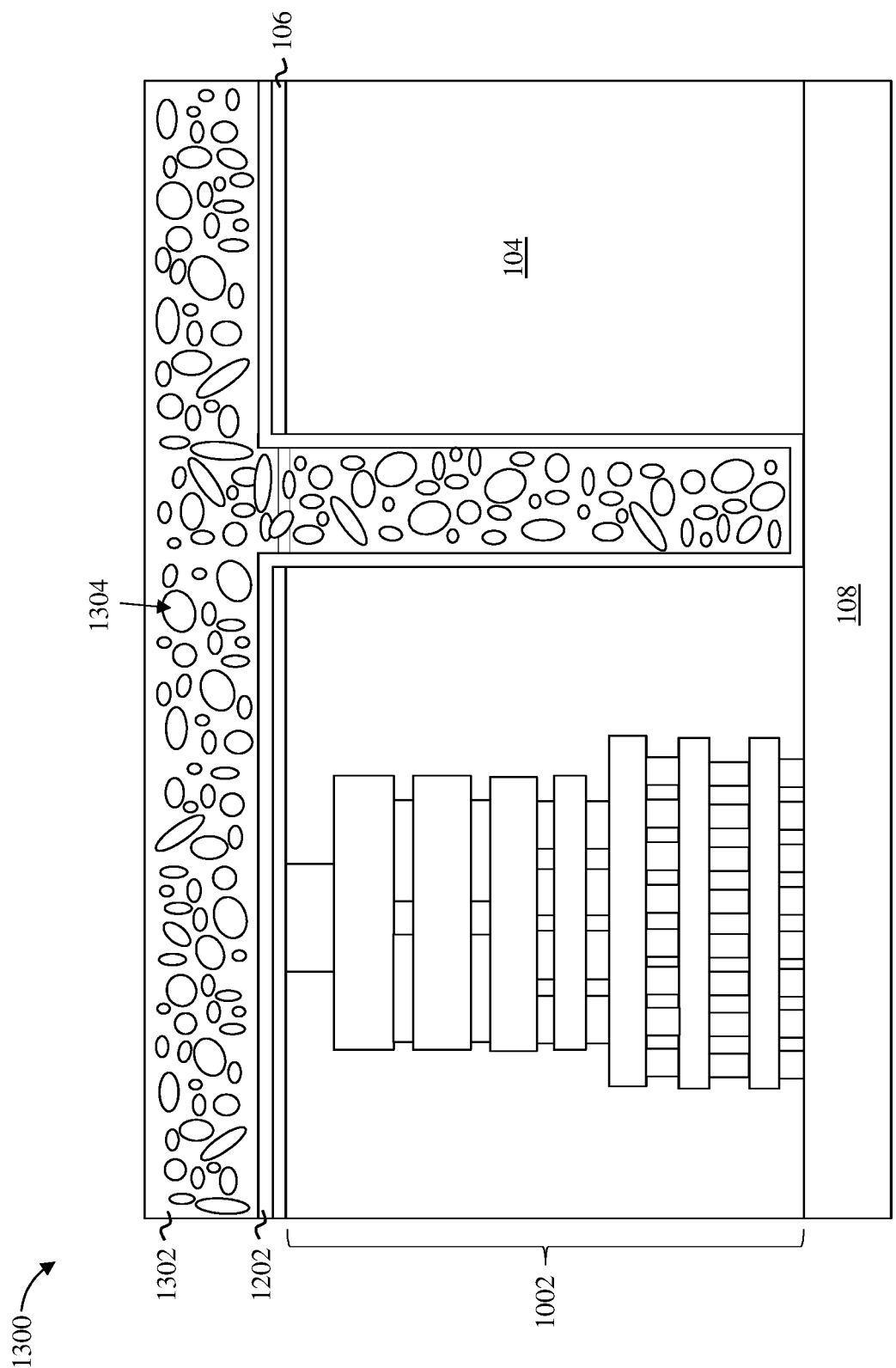
FIG. 16 depicts a cross-sectional view of a semiconductor structure after a processing operation according to one or more embodiments of the invention.

FIG. 16 depicts a cross-sectional view of the semiconductor structure 1300 after a processing operation according to one or more embodiments of the invention. As illustrated in FIG. 16, the one or more trenches 1104 can be filled with a nanocomposite coating 1302 having inclusions 1304. The nanocomposite 1302 and inclusions 1304 can be formed in a similar manner as the nanocomposite 302 and inclusions 304 described with respect to FIG. 6. Advantageously, forming the nanocomposite coating 1302 having inclusions 1304 within the trenches 1104 results in the nanocomposite coating 1302 having a full metallization stack thickness. In other words, the nanocomposite coating 1302 can extend to match the entire length (through all layers) of the metallization layers (the metal interconnects 1002).

Figure 17:
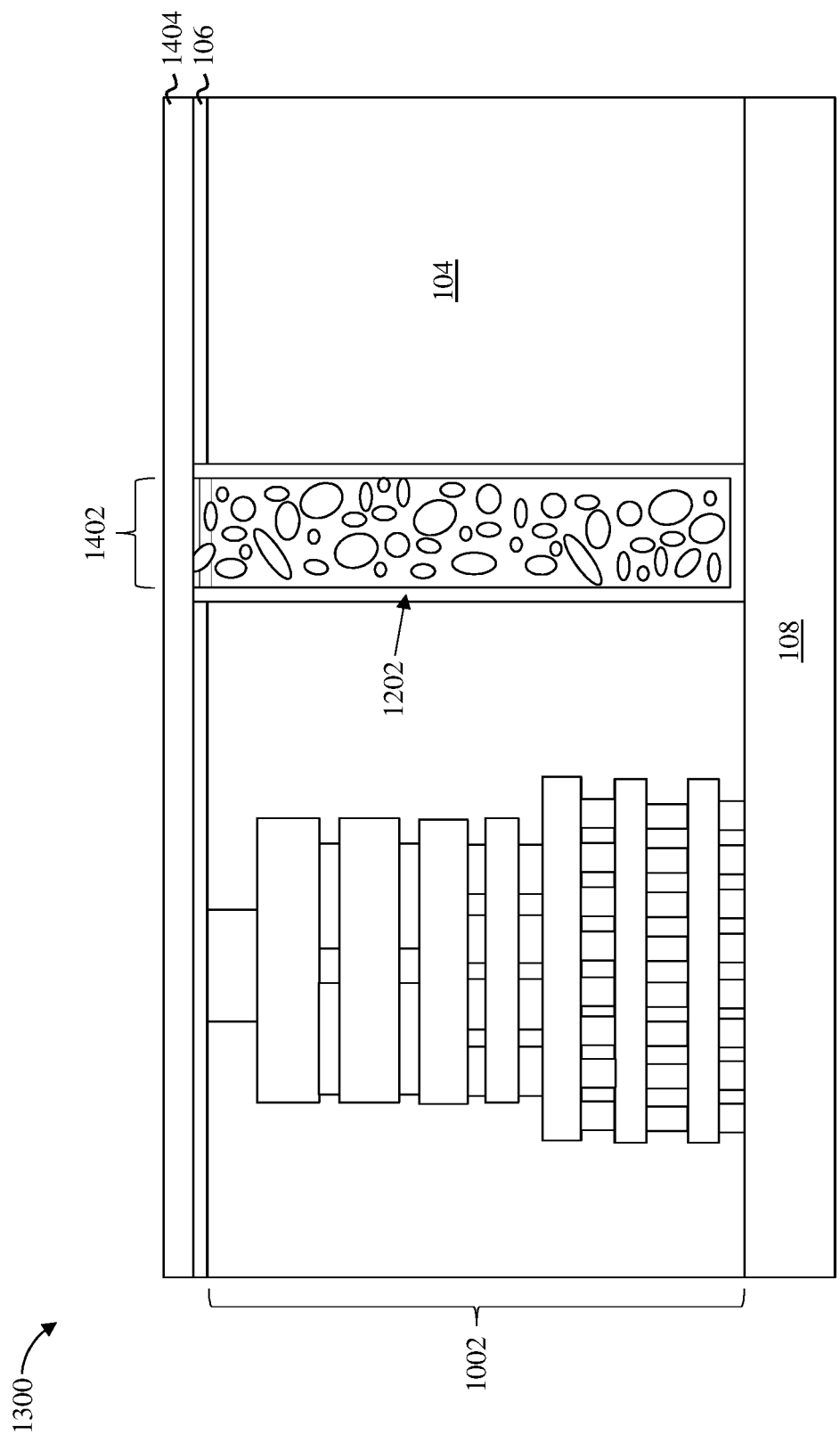
FIG. 17 depicts a cross-sectional view of a semiconductor structure after a processing operation according to one or more embodiments of the invention.

FIG. 17 depicts a cross-sectional view of the semiconductor structure 1300 after a processing operation according to one or more embodiments of the invention. As illustrated in FIG. 17, the semiconductor structure 1300 can be polished to a surface of the hard mask 110 (or the cap layers 106 if the hard mask 110 is removed upstream) using, for example, CMP. In this manner, the nanocomposite coating 1302 can be separated to define one or more topologically interlocking composite structures 1402.

In some embodiments of the invention, a hard mask 1404 can be formed over the cap layers 106, the liner 1202, and the composite structures 1402. The hard mask 1404 can be made of any suitable hard mask material, such as, for example, SiCHN or SiN. Any known manner of forming the hard mask 1404 can be utilized, such as, for example, CVD, PECVD, ALD, flowable CVD, spin-on dielectrics, or PVD. In some embodiments of the invention, the hard mask 1404 is formed to a thickness of 20 nm, although other thicknesses are within the contemplated scope of the invention. In some embodiments of the invention, the FBEOL is completed after forming the hard mask 1404.

Figure 18:
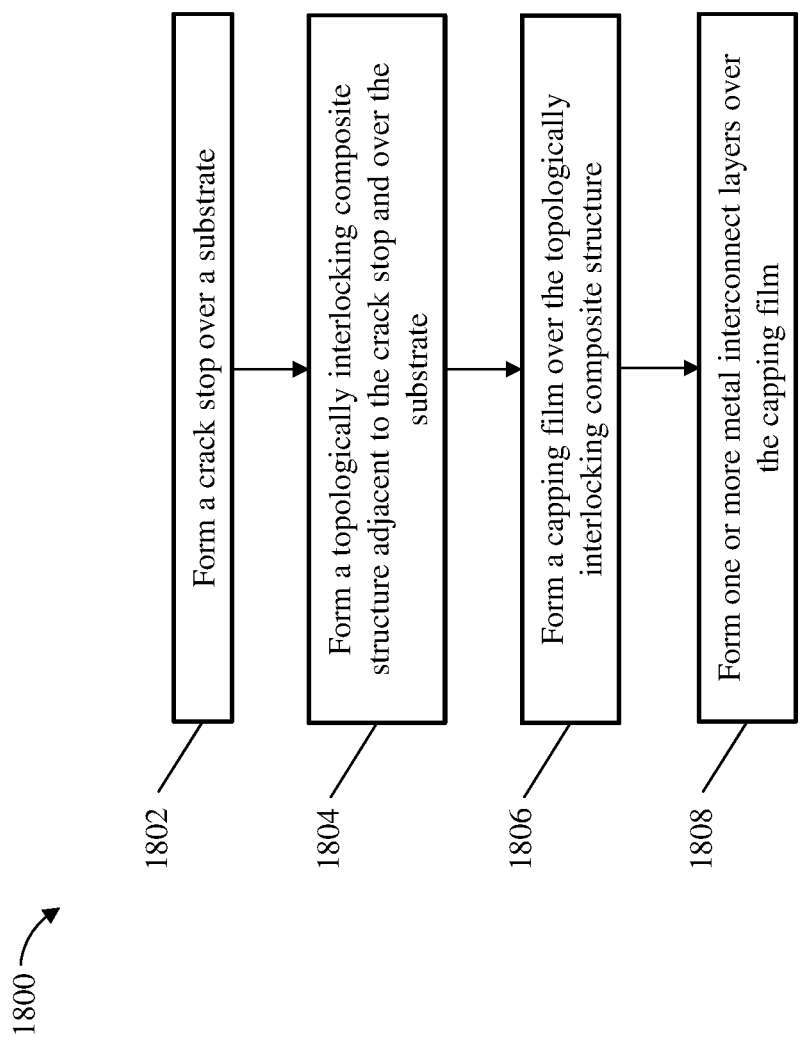
FIG. 18 depicts a flow diagram illustrating a method according to one or more embodiments of the invention.

FIG. 18 depicts a flow diagram 1800 illustrating a method for forming a semiconductor device according to one or more embodiments of the invention. As shown at block 1802, a crack stop is formed over a substrate. The crack stop can span one or more dielectric layers. The crack stop can be formed in a similar manner as the crack stop depicted in FIG. 4 (collectively, the additional metal interconnects 504 and the metal interconnects 102).

At block 1804, a topologically interlocking composite structure is formed adjacent to the crack stop and over the substrate. The topologically interlocking composite structure can span the one or more dielectric layers. The topologically interlocking composite structure can be formed in a similar manner as the topologically interlocking composite structures 402 discussed previously herein with respect to FIG. 5 or the topologically interlocking composite structures 802 discussed previously herein with respect to FIG. 9. For example, a trench can be formed in the one or more dielectric layers to expose a surface of the substrate, a liner can be formed in the trench on the exposed surface of the substrate and on sidewalls of the one or more dielectric layers, and a nanocomposite coating can be deposited in the trench. In some embodiments of the invention, the liner is conformally deposited in the trench. In some embodiments of the invention, the liner includes a superconformal (SC) nitride film. In some embodiments of the invention, the liner includes a nominal thickness of about 10 nm or less.

The nanocomposite coating can include a bulk matrix material and a plurality of embedded inclusions. To promote crack bifurcation, materials of the inclusions and bulk matrix material are selected to ensure that the Young's modulus of the inclusions is greater than the Young's modulus of the bulk matrix material. In some embodiments of the invention, a ratio of the Young's modulus of the embedded inclusions to the Young's modulus of the bulk matrix material is at least 2.0.

At block 1806, a cap layer (capping film) is formed over the topologically interlocking composite structure. At block 1808, one or more metal interconnect layers are formed over the cap layer. The one or more metal interconnect layers can be formed in a similar manner as the additional metal interconnects 504 discussed previously herein with respect to FIG. 5.

The method can further include recessing the trench below a surface of the substrate. In this manner, the topologically interlocking composite structure can penetrate beneath the surface of the substrate, in a similar manner as the topologically interlocking composite structures 802 discussed previously herein with respect to FIG. 9.

Figure 19:
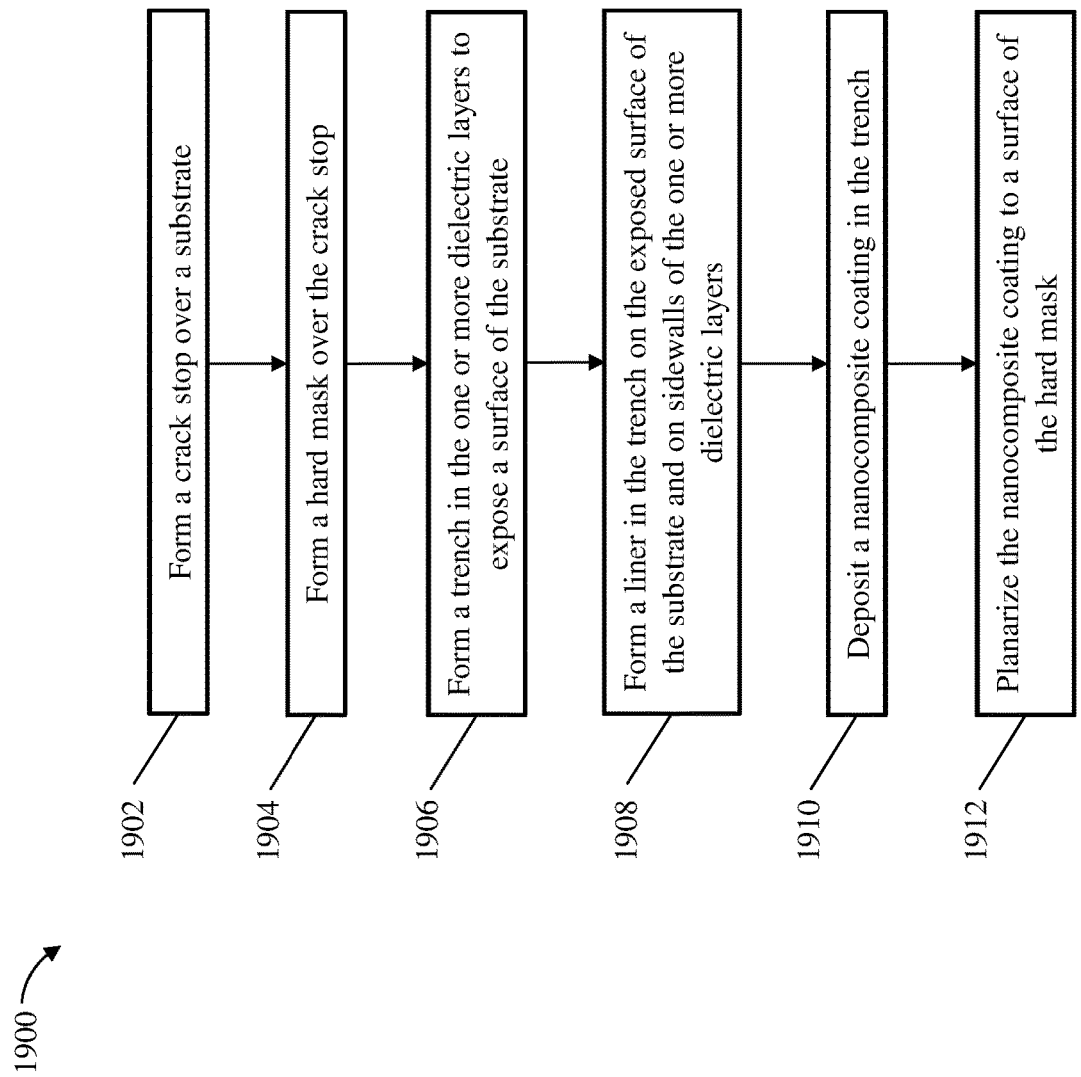
FIG. 19 depicts a flow diagram illustrating a method according to one or more embodiments of the invention.

FIG. 19 depicts a flow diagram 1900 illustrating a method for forming a semiconductor device according to one or more embodiments of the invention. As shown at block 1902, a crack stop is formed over a substrate. The crack stop can span one or more dielectric layers. The crack stop can be formed in a similar manner as the metal interconnects 1002 depicted in FIG. 10. At block 1904, a cap layer is formed over the crack stop. The cap layer can be formed in a similar manner as the cap layers 106 depicted in FIG. 10.

At block 1906, a trench is formed in the one or more dielectric layers to expose a surface of the substrate. At block 1908, a liner is formed in the trench on the exposed surface of the substrate and on sidewalls of the one or more dielectric layers. In some embodiments of the invention, the liner includes a SC nitride film. In some embodiments of the invention, the liner includes a nominal thickness of about 10 nm or less.

At block 1910, a nanocomposite coating is deposited in the trench. In some embodiments of the invention, the nanocomposite coating includes a bulk matrix material and a plurality of embedded inclusions. In some embodiments of the invention, the bulk matrix material comprises octamethylcyclotetrasiloxane (OMCTS) having a Young's modulus of about 9.2 GPa. In some embodiments of the invention, the embedded inclusions comprise tetraethyl orthosilicate (TEOS) having a Young's modulus of about 70 GPa. In some embodiments of the invention, a ratio of the Young's modulus of the embedded inclusions to the Young's modulus of the bulk matrix material is at least 2.0.

At block 1912, the nanocomposite coating is planarized to a surface of the cap layer. In some embodiments of the invention, the trench is recessed below a surface of the substrate prior to depositing the nanocomposite coating.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describe having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a crack stop over a substrate, the crack stop spanning one or more dielectric layers;
   forming a topologically interlocking composite structure adjacent to the crack stop and over the substrate, the topologically interlocking composite structure spanning the one or more dielectric layers, the topologically interlocking composite structure comprising a bulk matrix material and a plurality of embedded inclusions;
   forming a capping film over the topologically interlocking composite structure; and
   forming one or more metal interconnect layers over the capping film.

2. The method of claim 1, wherein forming the topologically interlocking composite structure comprises forming a trench in the one or more dielectric layers to expose a surface of the substrate.

3. The method of claim 2, wherein forming the topologically interlocking composite structure further comprises forming a dielectric liner in the trench on the exposed surface of the substrate and on sidewalls of the one or more dielectric layers.

4. The method of claim 3, wherein forming the topologically interlocking composite structure further comprises depositing a nanocomposite coating in the trench, the nanocomposite coating comprising the bulk matrix material and the plurality of embedded inclusions.

5. The method of claim 3, wherein the liner is conformally deposited in the trench.

6. The method of claim 5, wherein the liner comprises a superconformal (SC) nitride film.

7. The method of claim 6, wherein the liner comprises a nominal thickness of about 10 nm or less.

8. The method of claim 4, wherein a ratio of the Young's modulus of the embedded inclusions to the Young's modulus of the bulk matrix material is at least 2.0.

9. The method of claim 2, further comprising recessing the trench below a surface of the substrate.

10. A method for forming a semiconductor device, the method comprising:
    forming a crack stop over a substrate, the crack stop spanning one or more dielectric layers;
    forming a cap layer over the crack stop;
    forming a trench in the one or more dielectric layers to expose a surface of the substrate;
    forming a liner in the trench on the exposed surface of the substrate and on sidewalls of the one or more dielectric layers, the liner comprising a superconformal (SC) nitride film;
    depositing a nanocomposite coating in the trench, the nanocomposite coating comprising a bulk matrix material and a plurality of embedded inclusions; and
    planarizing the nanocomposite coating to a surface of the cap layer.

11. The method of claim 10, wherein the liner comprises a nominal thickness of about 10 nm or less.

12. The method of claim 10, wherein a ratio of the Young's modulus of the embedded inclusions to the Young's modulus of the bulk matrix material is at least 2.0.

13. The method of claim 10, further comprising recessing the trench below a surface of the substrate.

14. The method of claim 10, wherein the bulk matrix material comprises octamethylcyclotetrasiloxane (OMCTS) having a Young's modulus of about 9.2 GPa.

15. The method of claim 10, wherein the embedded inclusions comprise tetraethyl orthosilicate (TEOS) having a Young's modulus of about 70 GPa.

16. A semiconductor device comprising:
    a crack stop over a substrate, the crack stop spanning one or more dielectric layers;
    a topologically interlocking composite structure adjacent to the crack stop and over the substrate, the topologically interlocking composite structure spanning the one or more dielectric layers, the topologically interlocking composite structure comprising a nanocomposite coating comprising a bulk matrix material and a plurality of embedded inclusions;
    a cap layer over the topologically interlocking composite structure; and
    one or more metal interconnect layers over the cap layer.

17. The semiconductor device of claim 16 further comprising a superconformal (SC) nitride film between the topologically interlocking composite structure and the one or more dielectric layers.

18. The semiconductor device of claim 16, wherein a ratio of the Young's modulus of the embedded inclusions to the Young's modulus of the bulk matrix material is at least 2.0.

19. The semiconductor device of claim 16, wherein the bulk matrix material comprises octamethylcyclotetrasiloxane (OMCTS) having a Young's modulus of about 9.2 GPa.

20. The semiconductor device of claim 16, wherein the embedded inclusions comprise tetraethyl orthosilicate (TEOS) having a Young's modulus of about 70 GPa.

* * * * *